United States Patent
Endo

(10) Patent No.: US 11,408,786 B2
(45) Date of Patent: Aug. 9, 2022

(54) TORQUE SENSOR

(71) Applicant: NIDEC COPAL ELECTRONICS CORPORATION, Tokyo (JP)

(72) Inventor: Takayuki Endo, Sano (JP)

(73) Assignee: NIDEC COPAL ELECTRONICS CORPORATION, Tokyo (JP)

( * ) Notice: Subject to any disclaimer, the term of this patent is extended or adjusted under 35 U.S.C. 154(b) by 126 days.

(21) Appl. No.: 16/934,516

(22) Filed: Jul. 21, 2020

(65) Prior Publication Data

US 2020/0348195 A1  Nov. 5, 2020

Related U.S. Application Data

(63) Continuation of application No. PCT/JP2019/004752, filed on Feb. 8, 2019.

(30) Foreign Application Priority Data

Mar. 29, 2018  (JP) .............................. JP2018-063828

(51) Int. Cl.
| | | |
|---|---|---|
| *G01L 3/00* | (2006.01) | |
| *G01L 3/14* | (2006.01) | |
| *G01L 3/10* | (2006.01) | |

(52) U.S. Cl.
CPC ............ *G01L 3/1457* (2013.01); *G01L 3/108* (2013.01)

(58) Field of Classification Search
CPC ............................... G01L 3/1457; G01L 3/108
See application file for complete search history.

(56) References Cited

U.S. PATENT DOCUMENTS

| | | |
|---|---|---|
| 6,269,702 B1 | 8/2001 | Lambson |
| 2013/0319135 A1 | 12/2013 | Okada et al. |
| 2017/0153156 A1 * | 6/2017 | Nitz .................. G01L 5/226 |

(Continued)

FOREIGN PATENT DOCUMENTS

| | | |
|---|---|---|
| CN | 201096564 | 8/2008 |
| CN | 106415227 | 2/2017 |

(Continued)

OTHER PUBLICATIONS

Office Action issued in Chinese counterpart Application No. 201980011549.1 dated May 8, 2021, with an English translation thereof.

(Continued)

*Primary Examiner* — Max H Noori
(74) *Attorney, Agent, or Firm* — Burris Law, PLLC

(57) ABSTRACT

A torque sensor which can detect a torque with high accuracy is provided. First structure and second structure are connected by a plurality of third structures. First and second strain sensors are connected between the first structure and the second structure. Each of the first and second strain sensors includes a strain body connected between the first structure and the second structure and a plurality of sensor elements provided on the strain body. The sensor elements are disposed in a region of one side of each of the first structure and the second structure with respect to a longitudinal central portion of the strain body, and the region on the one side is a region where there is only a little difference in strain between along a torque direction of the strain body and a torque-excepted direction.

5 Claims, 16 Drawing Sheets

(56) References Cited

U.S. PATENT DOCUMENTS

| | | | |
|---|---|---|---|
| 2017/0266814 A1 | 9/2017 | Uemura et al. | |
| 2019/0250051 A1* | 8/2019 | Suzuki | G01L 3/10 |
| 2019/0271604 A1* | 9/2019 | Li | G01L 5/1627 |
| 2019/0310146 A1* | 10/2019 | Suzuki | G01L 3/108 |
| 2020/0033211 A1* | 1/2020 | Matich | G01L 5/1627 |
| 2020/0284667 A1* | 9/2020 | Glusiec | G01L 5/1627 |

FOREIGN PATENT DOCUMENTS

| | | |
|---|---|---|
| CN | 206540649 | 10/2017 |
| CN | 107407607 | 11/2017 |
| CN | 206627234 | 11/2017 |
| DE | 19525231 | 3/2004 |
| EP | 0575634 | 12/1993 |
| EP | 2322905 | 5/2011 |
| EP | 3219449 | 9/2017 |
| JP | 2013002864 | 1/2013 |
| JP | 2013096735 | 5/2013 |
| JP | 5640905 | 12/2014 |
| JP | 2015049209 | 3/2015 |
| JP | 2017172983 | 9/2017 |
| WO | 2014128506 | 8/2014 |

OTHER PUBLICATIONS

Extended European Search Report for European Application 19775527.5, dated Oct. 15, 2021.

International Search Report for International Application PCT/JP2019/004752, dated Mar. 12, 2019.

* cited by examiner

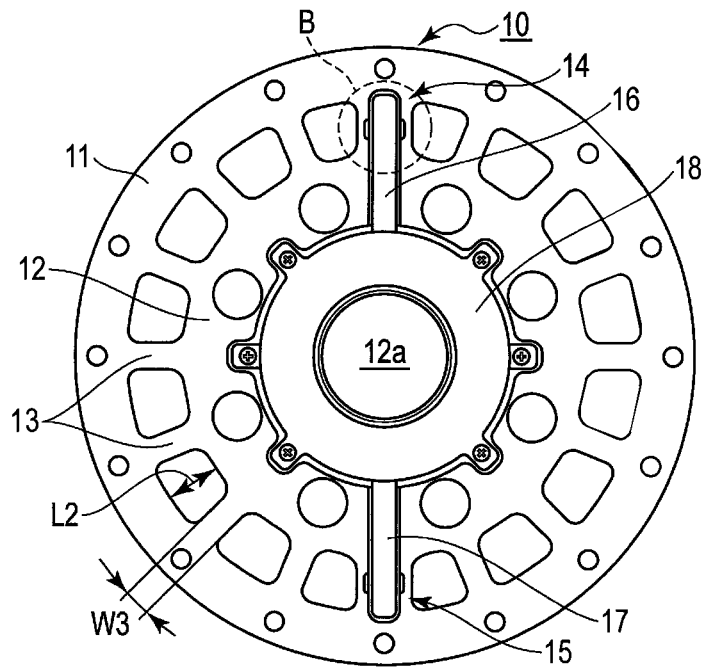
F I G. 1
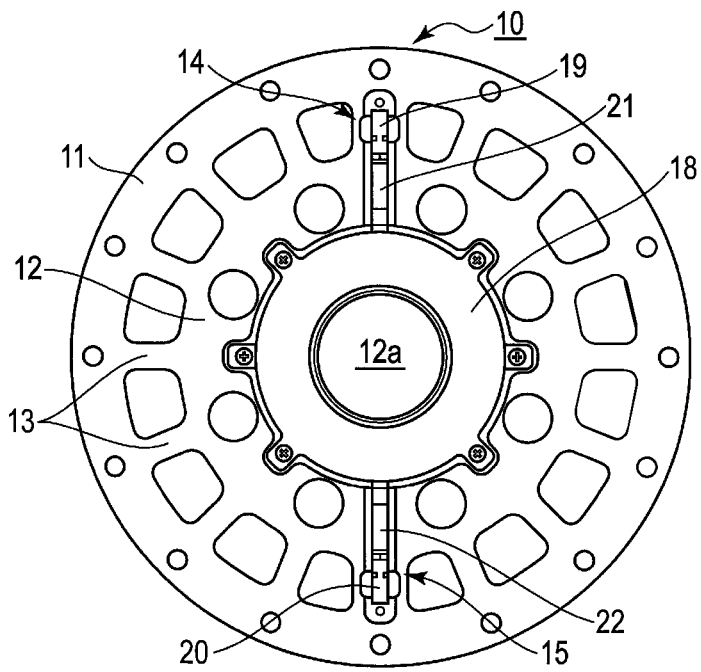
F I G. 2

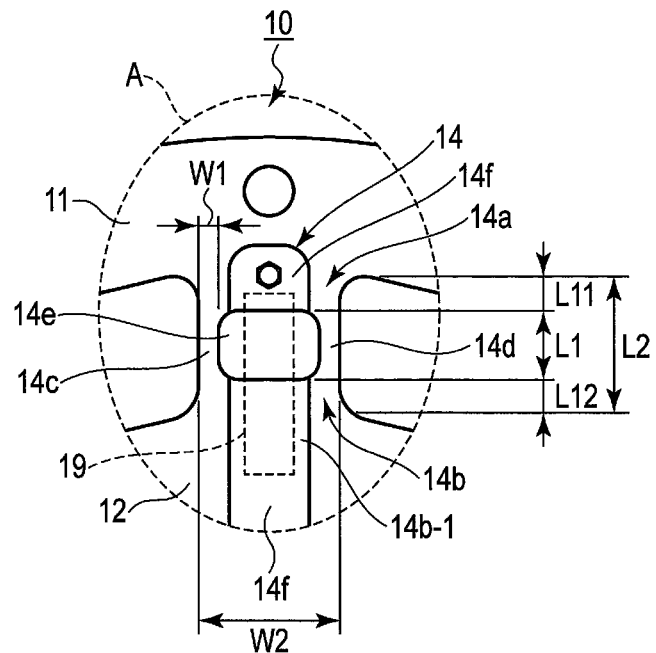
F I G. 5
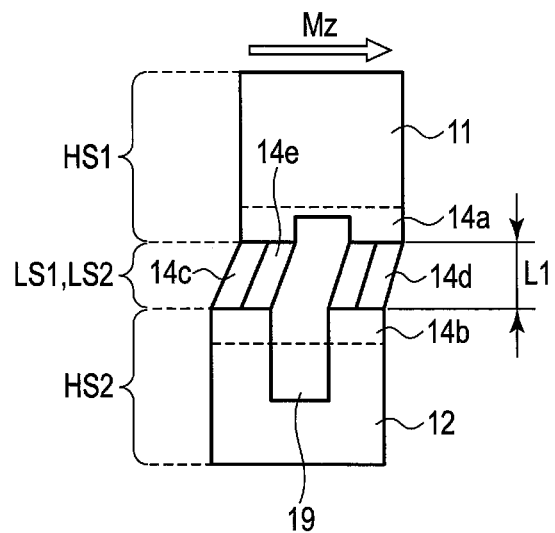
F I G. 6A

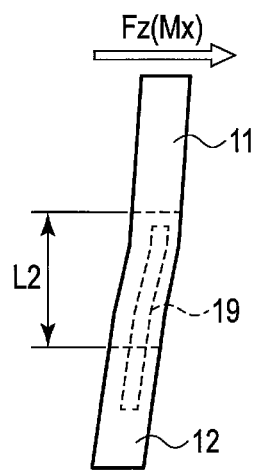
F I G. 6B
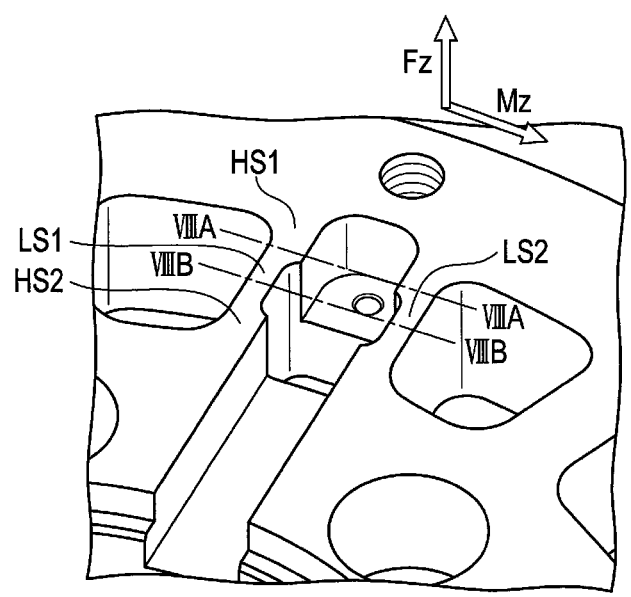
F I G. 7

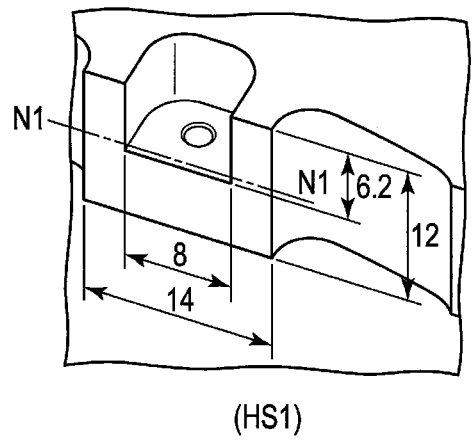
(HS1)
F I G. 8A
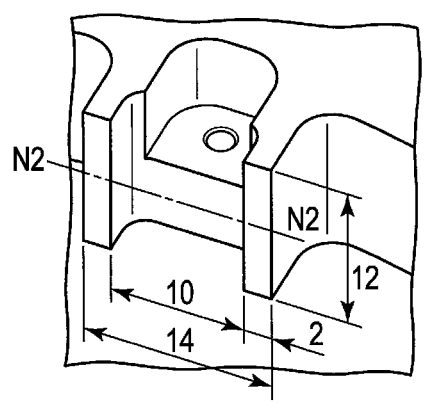
(LS1, LS2)
F I G. 8B (HS1)

(LS1,LS2)

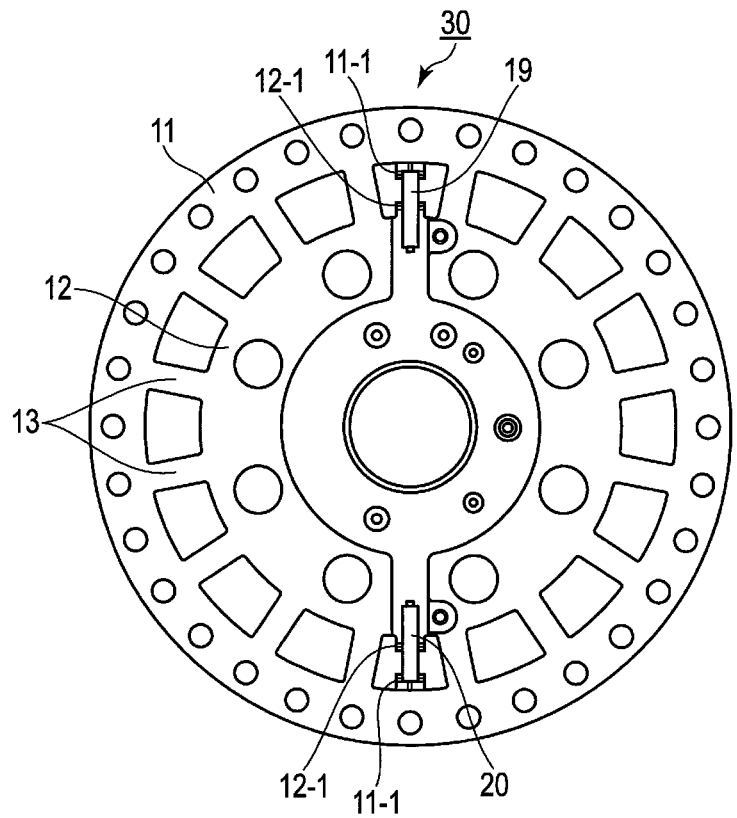
F I G. 9
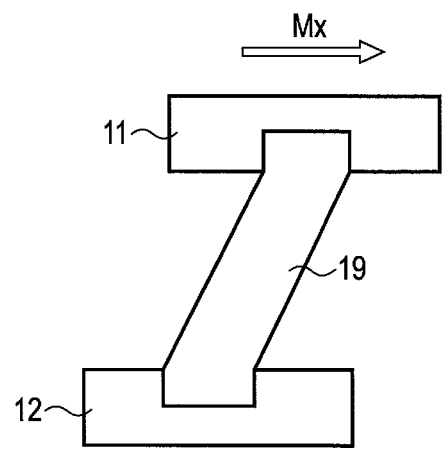
F I G. 10A

| Axis name | Comparative example | Embodiment |
|---|---|---|
| Fx | 123 μST | 114 μST |
| Fy | 246 μST | 126 μST |
| Fz | 84 μST | 3 μST |
| Mx | 207 μST | 26 μST |
| My | 71 μST | 63 μST |
| Mz | 130 μST | 188 μST |

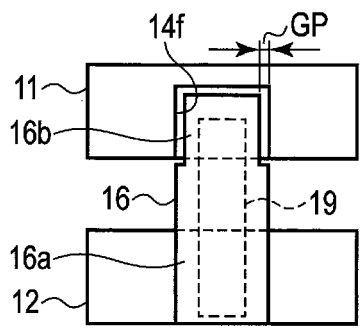
F I G. 17A
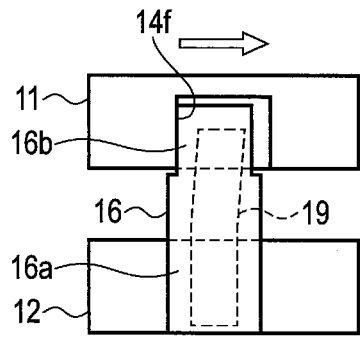
F I G. 17B
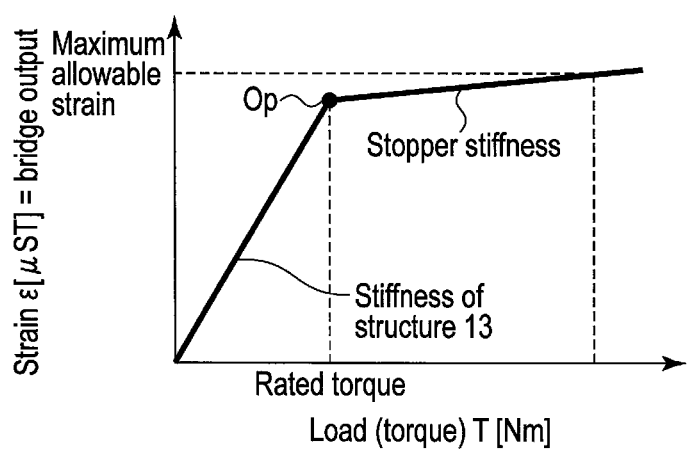
F I G. 18

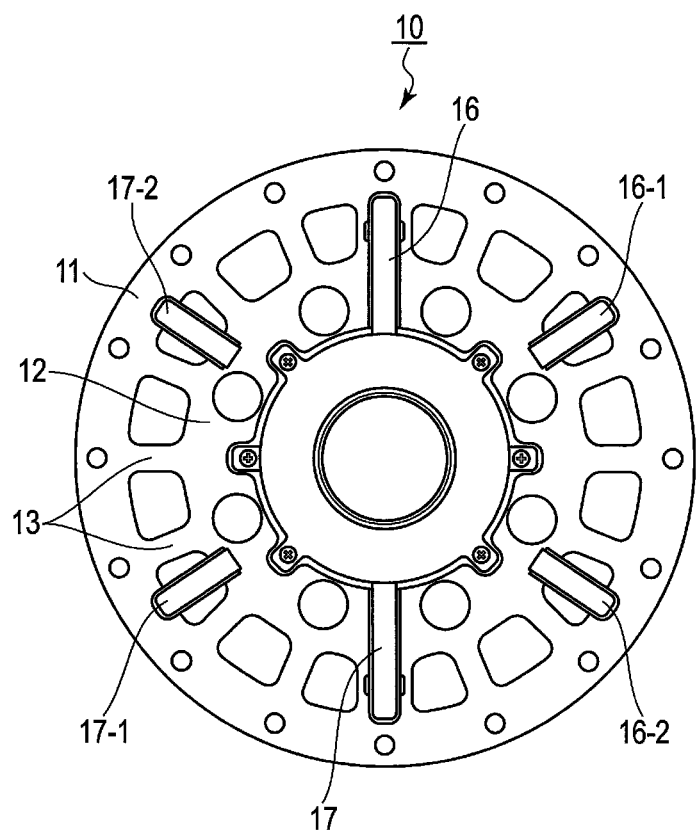
F I G. 21

TORQUE SENSOR

CROSS-REFERENCE TO RELATED APPLICATIONS

This application is a continuation of International Application No. PCT/JP2019/004752, filed on Feb. 8, 2019, which claims priority to and the benefit of Japanese Patent Application No. 2018-063828, filed on Mar. 29, 2018. The disclosures of the above applications are incorporated herein by reference.

FIELD

The present disclosure relates to a torque sensor to be provided on, for example, an articulation of a robot arm.

BACKGROUND

A torque sensor includes a first structure to which torque is applied, a second structure from which torque is output, and a plurality of strain sections serving as beams configured to couple the first structure and the second structure to each other, and a plurality of strain gages serving as sensor elements are arranged on these strain sections. A bridge circuit is constituted of these strain gages (refer to, for example, Patent Literature 1 (JP 2013-096735 A), Patent Literature 2 (JP 2015-049209), and Patent Literature 3 (JP 2017-172983 A)).

SUMMARY

It is necessary for a bridge circuit of a torque sensor to be configured to output a voltage for force in the torque direction, and not to output a voltage for force in the torque-excepted direction. However, this is based on the prerequisite that the structure of the torque sensor is processed precisely and a strain gauge is disposed precisely at a predetermined position of the structure. Thus, it depends on the accuracy of processing the structure and the displacement accuracy of the strain gauge with respect to the structure.

An object of the embodiments is to provide a torque sensor which can detect a torque with high accuracy without depending on the accuracy of processing the structure and the displacement accuracy of the strain gauge with respect to the structure.

According to an embodiment, there is provided a torque sensor comprising a first structure, a second structure, a plurality of third structures connecting the first structure and the second structure, and at least one strain sensor connected between the first structure and the second structure, wherein the at least one strain sensor comprises a strain body connected between the first structure and the second structure and a plurality of sensor elements provided on the strain body, the plurality of sensor elements are disposed in a region of one side of each of the first structure and the second structure with respect to a longitudinal central portion of the strain body, and the region on the one side is a region where there is only a little difference in strain between along a torque direction of the strain body and a torque-excepted direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a plan view showing a torque sensor to which each of embodiments is applied.

FIG. 2 is a plan view showing FIG. 1 part of which is excluded.

FIG. 5 is a plan view showing the enlarged part A indicated by a broken line in FIG. 3.

FIG. 6A is a plan view shown for explaining an operation of a case where force in the torque (Mz) direction is applied to the torque sensor shown in FIG. 5.

FIG. 6B is a side view shown for explaining an operation of a case where force in the torque-excepted (Fz, Mx) direction is applied to the torque sensor shown in FIG. 5.

FIG. 7 is a perspective view showing the structure shown in FIG. 5.

FIG. 8A is a cross-sectional view along line VIIIA-VIIIA shown in FIG. 7, and is a view for explaining second moment of area in the torque-excepted (Fz, Mx) direction.

FIG. 8B is a cross-sectional view along line VIIIB-VIIIB shown in FIG. 7, and is a view for explaining second moment of area in the torque-excepted (Fz, Mx) direction.

FIG. 9 is a plan view showing a torque sensor according to a comparative example of the first embodiment.

FIG. 10A is a plan view shown for explaining an operation of a case where force in the torque (Mz) direction is applied to the torque sensor shown in FIG. 9.

FIG. 17A is a view showing the operation of a stopper and schematically showing part of FIG. 16.

FIG. 17B is a view showing the operation of a stopper different from FIG. 17A and schematically showing part of FIG. 16.

FIG. 18 is a view shown for explaining a relationship between the torque applied to the torque sensor and operation of the stopper.

FIG. 21 is a plan view showing a second modification example of the third embodiment.

DETAILED DESCRIPTION

Figure 3:
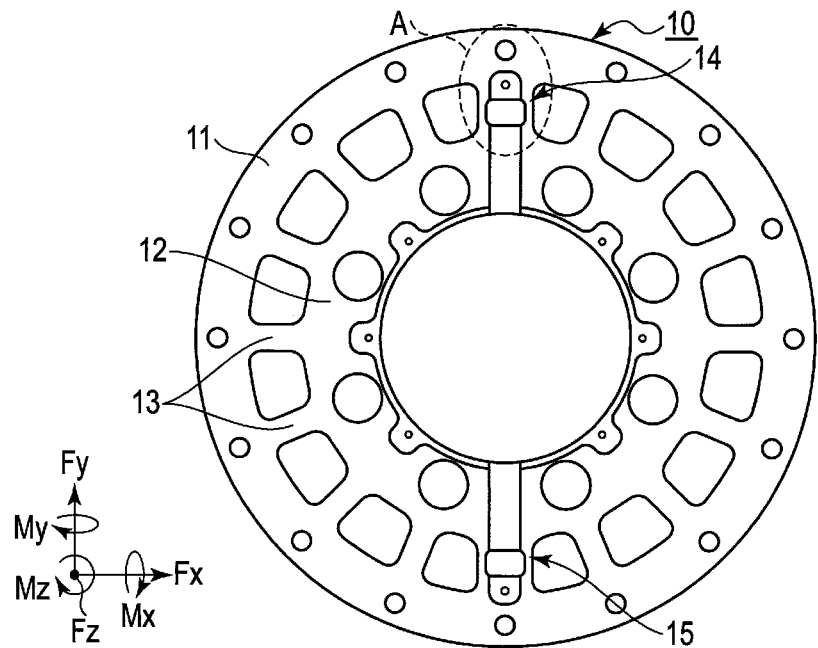
FIG. 3 is a plan view showing the torque sensor of FIG. 2 part of which is excluded and according to a first embodiment.

The Hereinafter embodiments of the present invention will be described below with reference to the accompanying drawings. In the drawings, the same parts are denoted by the same reference symbols.

FIG. 1 shows an example of a torque sensor 10 to which this embodiment is applied.

In FIG. 1, the torque sensor 10 comprises a first structure 11, second structure 12, plurality of third structures 13, fourth structure 14, fifth structure 15, stoppers 16 and 17, and cover 18.

Each of the first structure 11 and second structure 12 is formed into an annular shape and the diameter of the second structure 12 is less than the diameter of the first structure 11. The second structure 12 is arranged concentric with the first structure 11, and first structure 11 and second structure 12 are coupled to each other by the third structures 13 serving as a plurality of radially arranged beam sections. The second structure includes a hollow section 12a, and, for example, wiring not shown is passed through the hollow section 12a.

The first structure 11 is coupled to, for example, an object to be measured, and the plurality of third structures 13 transmit torque from the first structure 11 to the second structure 12. Conversely, the second structure 12 may be coupled to the object to be measured, and torque may be transmitted from the second structure 12 to the first structure 11 through the plurality of third structures 13.

Although the first structure 11, second structure 12, and plurality of third structures 13 are constituted of metal, for example, stainless steel, materials other than metal can also be used if mechanical strength can sufficiently be obtained with respect to the applied torque.

FIG. 2 shows the state where the stoppers 16 and 17 of FIG. 1 are removed. Between the first structure 11 and second structure 12, a first strain sensor 19 and second strain sensor 20 are provided. That is, as will be described later, one end of each of the first strain sensor 19 and second strain sensor 20 is joined to the first structure 11, and the other end of each of the first strain sensor 19 and second strain sensor 20 is joined to the second structure 12.

Further, the first strain sensor 19 and second strain sensor 20 are arranged at positions symmetrical with respect to the center (center of action of torque) of each of the first structure 11 and second structure 12. In other words, the first strain sensor 19 and second strain sensor 20 are arranged on the diameters of the annular first structure 11 and second structure 12.

A thickness of each of the first strain sensor 19 and second strain sensor 20, i.e., thickness of a strain body to be described later is less than the thickness of the third structure 13. The mechanical strength of the torque sensor 10 is set according to the thickness and width of the third structure 13. The strain body is provided with a plurality of strain gages functioning as sensor elements, and a bridge circuit is constituted of these sensor elements.

Each of the stoppers 16 and 17 has a function of protecting each of the first strain sensor 19 and second strain sensor 20 from mechanical deformation, and serving as a cover of each of the first strain sensor 19 and second strain sensor 20. Details of the stoppers 16 and 17 will be described later.

The first strain sensor 19 is connected to a flexible board 21 and second strain sensor 20 is connected to a flexible board 22. The flexible boards 21 and 22 are connected to a printed board (not shown) covered with a cover 18. On the printed board, an operational amplifier and the like configured to amplify an output voltage of the bridge circuit to be described later are arranged. The circuit configuration is not the nature of this embodiment, and a description thereof is omitted.

First Embodiment

Figure 4:
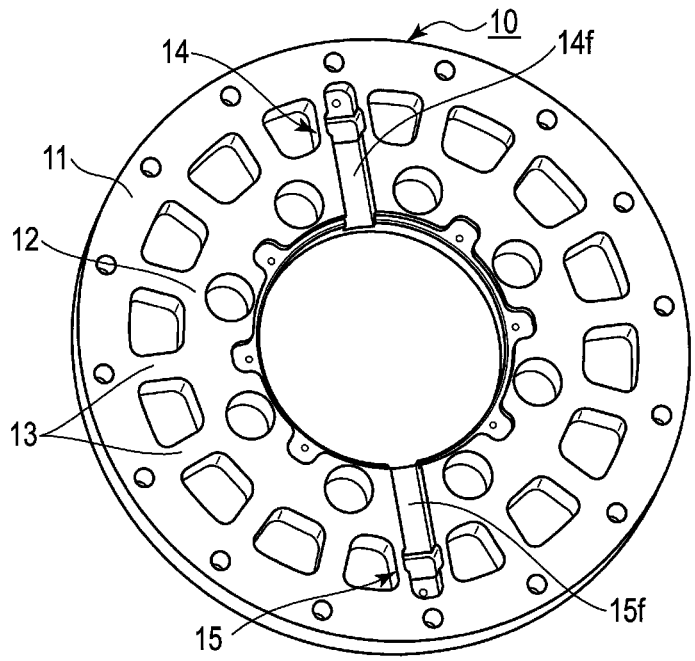
FIG. 4 is a perspective view of FIG. 3.

FIG. 3 and FIG. 4 are views showing a first embodiment, are formed by removing the first strain sensor 19, second strain sensor 20, flexible boards 21 and 22, cover 18 and the like from FIG. 1 and FIG. 2, and show only the first structure 11, second structure 12, plurality of third structures 13, fourth structure 14, and fifth structure 15.

The first embodiment is configured to have such a structure that, when force in the direction other than the torque direction Mz, particularly, in the Fz direction or Mx direction indicated by the arrow shown in FIG. 3 is applied to the torque sensor 10, strain is not concentrated at the plurality of strain gages serving as sensor elements and provided on the strain bodies of the first strain sensor 19 and second strain sensor 20.

More specifically, the fourth structure 14 and fifth structure 15 are provided at positions symmetrical with respect to the center of each of the first structure 11 and second structure 12, fourth structure 14 includes a concave section 14f continuous from the first structure 11 to the second structure 12, and fifth structure includes a concave section 15f continuous from the first structure 11 to the second structure 12. As will be described later, the first strain sensor 19 is arranged inside the concave section 14f of the fourth structure 14, and second strain sensor 20 is arranged inside the concave section 15f of the fifth structure 15.

It should be noted that although the first embodiment is shown about the case where two strain sensors including the first strain sensor 19 and second strain sensor 20 are provided, the number of strain sensors may be three or more. In this case, it is sufficient if the number of structures is increased according to the number of strain sensors.

The fourth structure 14 and fifth structure 15 are identical in the structure, and hence only the fourth structure 14 will specifically be described below.

As shown in FIG. 5, the fourth structure 14 includes a first connection section 14a and second connection section 14b serving as a joint section configured to join the first strain sensor 19, third connection section 14c and fourth connection section 14d serving as a beam, and opening 14e surrounded by the first connection section 14a, second connection section 14b, third connection section 14c, and fourth connection section 14d.

In other words, the fourth structure 14 is a beam including the opening 14e provided between the first structure 11 and second structure 12.

The first connection section 14a extends from the first structure 11 to the second structure 12 side. The second connection section 14b extends from the second structure 12 to the first structure 11 side.

The third connection section 14c and fourth connection section 14d serving as the beam are provided between the first connection section 14a and second connection section 14b.

The length L1 of each of the third connection section 14c and fourth connection section 14d is shorter than the length L2 (shown also in FIG. 1) of the third structure 13 serving as the beam. The width W1 of each of the third connection section 14c and fourth connection 14d in the torque (Mz) direction is narrower than the width W2 of each of the first connection section 14a and second connection section 14b in the torque direction, the total of the widths W1 of the third connection section 14c and fourth connection section 14d is narrower than the width W3 (shown in FIG. 1) of the third structure 13 in the torque (Mz) direction. For this reason, the stiffness of the third connection section 14c and fourth connection section 14d in the torque direction is lower than the stiffness of each of the first connection section 14a, second connection section 14b, and third structure 13 in the torque direction.

Further, the thickness of each of the third connection section 14c and fourth connection section 14d in the Fz direction is equal to the thickness of each of the first structure, second structure, and third structure in the Fz direction. Furthermore, the total of the length L11 of the first connection section 14a, length L12 of the second connection section 14b, and length L1 of the third connection section 14c or fourth connection section 14d is equal to the length of the third structure 13. Accordingly, the stiffness of the third connection section 14c and fourth connection section 14d in the Fz direction becomes somewhat less than the stiffness of the third structure 13 in the Fz direction.

That is, as shown in FIG. 6A to be described later, in the torque (Mz) direction, the first connection section 14a and first structure 11 constitute a high-stiffness section HS1, and second connection section 14b and second structure 12 constitute a high-stiffness section HS2. Furthermore, in the torque (Mz) direction, the third connection section 14c constitutes a low-stiffness section LS1, and fourth connection section 14d constitutes a low-stiffness section LS2.

It should be noted that the total of the length L11 of the first connection section 14a, length L12 of the second connection 14b, and length L1 of the third connection section 14c or fourth connection section 14d is not limited to the case where the total is equal to the length of the third structure 13, and may not be equal to the length of the third structure 13.

The first connection section 14a includes the aforementioned concave section 14f. The thickness of the whole part of the concave section 14f is less than the thickness of each of the first to third structures 11, 12, and 13.

One end of the first strain sensor 19 is connected to the concave section 14f of the first connection section 14a, and the other end thereof is connected to the concave section 14f of the second connection section 14b. Accordingly, the first strain sensor 19 lies astride the opening 14e. The bottom of the concave section 14f is positioned lower than the center of the thickness of the fourth structure 14, and the upper surface of the strain body constituting the first strain sensor 19 is made flush with a plane including the center of gravity of a structure constituted of the first structure 11, second structure 12, plurality of third structures 13, fourth structure 14, and fifth structure 15.

FIG. 6A and FIG. 6B are views schematically showing FIG. 5, FIG. 6A shows a case where force in the torque (Mz) direction is applied to the torque sensor 10, and FIG. 6B shows a case where force in the torque-excepted (Fz, Mx) direction is applied to the torque sensor 10.

As shown in FIG. 6A, when force in the torque (Mz) direction is applied to the torque sensor 10, the third connection section 14c and fourth connection section 14d functioning as the low-stiffness sections LS1 and LS2 become deformed, whereby the first strain sensor 19 (second strain sensor 20) becomes deformed, and the torque can be detected.

On the other hand, as shown in FIG. 6B, when force in the torque-excepted (Fz, Mx) direction is applied to the torque sensor 10, i.e., when the first structure 11 is displaced in the direction indicated by the arrow in FIG. 6B with respect to the second structure 12, the stiffness of the first connection section 14a and second connection section 14b, and stiffness of the third connection section 14c and fourth connection section 14d are approximately equal to each other. Accordingly, the total length L2 of the length L11 of the first connection section 14a, length L12 of the second connection section 14b, and length L1 of the third connection section 14c or fourth connection section 14d acts as the effective length. The length L2 is longer than the length L1 of the third connection section 14c or fourth connection section 14d, and hence when force in the torque-excepted (Fz, Mx) direction is applied, deformation of the first strain sensor 19 (second strain sensor 20) takes place within the range of the length L2, it is possible to prevent the strain from being concentrated at the plurality of strain gages serving as the sensor elements provided on the strain body of the first strain sensor 19, and it is possible to prevent the detection accuracy of the first strain sensor 19 (second strain sensor 20) from being deteriorated.

FIG. 7 is a view schematically showing the fourth structure 14. The second moment of area (deformability) of the fourth structure 14 and requirements for the fourth structure 14 (fifth structure 15) will be described below with reference to FIG. 7.

It is assumed here that second moment of area of a case where the high-stiffness section HS2 of the fourth structure 14 is fixed and force in the torque (Mz) direction is applied to the high-stiffness section HS1 is expressed by Js, second moment of area of a case where force in the torque (Mz) direction is applied to the low-stiffness sections LS1 and LS2 is expressed by Jw, second moment of area of a case where force in the torque-excepted (Fz) direction is applied to the high-stiffness section HS1 is expressed by Is, and second moment of area of a case where force in the torque-excepted (Fz) direction is applied to the low-stiffness sections LS1 and LS2 is expressed by Iw.

The ratio between the second moment of area of the high-stiffness section HS1 in the torque (Mz) direction and second moment of area of the low-stiffness sections LS1 and LS2 is expressed by the following formula (1).

$$Js/Jw \tag{1}$$

The ratio between the second moment of area of the high-stiffness section HS1 in the torque-excepted (Fz) direction and second moment of area of the low-stiffness sections LS1 and LS2 is expressed by the following formula (2).

$$Is/Iw \tag{2}$$

When each of the values of the formulas (1) and (2) is "1," the second moment of area of the high-stiffness section HS1 and second moment of area of the low-stiffness sections LS1 and LS2 are equal to each other, and deformation is not concentrated at the low-stiffness sections LS1 and LS2. The greater each of the values of the formulas (1) and (2) than "1," the higher the concentration of deformation at the low-stiffness sections LS1 and LS2 is.

In order to concentrate the strain at the plurality of strain gages serving as sensor elements provided on the strain body of the first strain sensor 19 in the case where force in the torque (Mz) direction is applied, and in order to displace the strain-concentrated position from the strain gages in the case where force in the torque-excepted (Fz, Mx) direction is applied, it is desirable that the degree of deformation concentration ($\alpha$) on one side be close to 1 ($\alpha \to 1$), and degree of deformation concentration ($\beta$) on the other side be enormously greater than the degree of deformation concentration ($\alpha$) ($\beta \gg \alpha$).

When the degree of deformation concentration at the low-stiffness sections LS1 and LS2 in the case where force in the torque (Mz) direction is applied is greater than the degree of deformation concentration at the low-stiffness sections LS1 and LS2 in the case where force in the torque-excepted (Fz) direction is applied, the fourth structure 14 (fifth structure 15) is easily deformable with respect to the force in the torque direction, and is hardly deformable in the torque-excepted direction. That is, it is the condition required of the fourth structure 14 (fifth structure 15) that the relationship indicated by the following formula (3) be established.

$$Js/Jw > Is/Iw \tag{3}$$

More specifically, FIG. 8A is a cross-sectional view along line VIIIA-VIIIA shown in FIG. 7, and shows an example of the dimensions of the high-stiffness section HS1. FIG. 8B is a cross-sectional view along line VIIIB-VIIIB shown in FIG. 7, and shows an example of the dimensions of the low-stiffness sections LS1 and LS2.

As shown in FIG. 8A, the second moment of area Is concerning the axis N1-N1 of a case where force in the torque-excepted (Fz) direction is applied to the high-stiffness section HS1 having a U-shaped cross section is as follows. Here, the axis N1-N1 is an axis passing through the center of the high-stiffness section HS1 in the thickness direction.

Figure 8C:
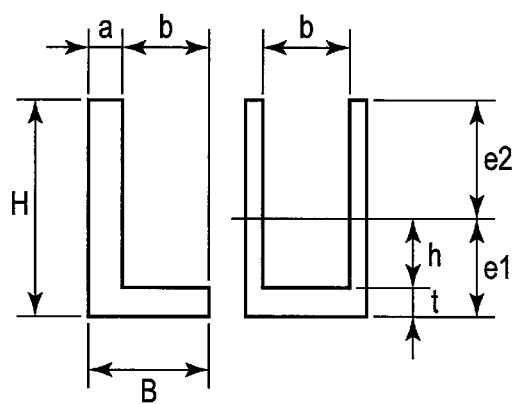
FIG. 8C is a view shown for explaining second moment of area of a general structure.

As shown in FIG. 8C, in general, when dimensions of both a structure having an L-shaped cross section and structure having a U-shaped cross section satisfy the relationships of $b=B-a$, $h=e_1-t$, the second moment of area Is of the structure having the L-shaped cross section and second moment of area Is of the structure having the U-shaped cross section are equal to each other, and are expressed by the following formula (4).

$$Is=(Be_1^3-bh^3+ae_2^3)/3 \tag{4}$$

Here, $h=e_1-t$, $$e_1=(aH^2+bt^2)/(2(aH+bt))$$

$$e_2=H-e_1$$

Accordingly, the second moment of area Is concerning the axis N1-N1 in the case where force in the torque-excepted (Fz) direction is applied to the high-stiffness section HS1 shown in FIG. 8A can be obtained by the formula (4).

It should be noted that $e_1$ is the position of the center of gravity in the structure functioning as an elastic body and constituted of the first structure 11, second structure 12, plurality of third structures 13, fourth structure 14, and fifth structure 15, and is half the thickness of the structure. Accordingly, $e_1$ becomes approximately 6 with respect to the thickness H (=12) (H=12, $e_1 \approx 6$). Accordingly, $e_2$ is approximately 6 ($e_2 \approx 6$ is obtained).

When the dimensions shown in FIG. 8A are substituted into the formula (4), the following result is obtained.

$$Is = (Be_1^3 - bh^3 + ae_2^3)/3$$
$$= (14 \times 6^3 - 8 \times (6-5.8)^3 + 6 \times 6^3)/3$$
$$= 1440$$

Further, as shown in FIG. 8B, the second moment of area Is concerning the axis N2-N2 of a case where force in the torque-excepted (Fz) direction is applied to the low-stiffness sections LS1 and LS2 each of which has a rectangular cross section is as follows. Here, the axis N2-N2 is an axis passing through the centers of the low-stiffness sections LS1 and LS2 in the thickness direction.

Figure 8D:
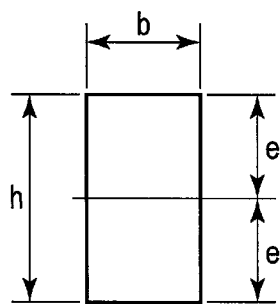
FIG. 8D is a view shown for explaining second moment of area of a structure different from FIG. 8C.

As shown in FIG. 8D, in general, the second moment of area Iw' of a structure having a rectangular cross section is expressed by the following formula (5).

$$Iw'=bh^3/12 \tag{5}$$

When the dimensions shown in FIG. 8B are substituted into the formula (5), the following result is obtained.

$$Iw' = 2 \times 12^3 / 12$$
$$= 288$$

The low-stiffness sections LS1 and LS2 shown in FIG. 8B have two rectangular cross sections in all, and hence the second moment of area Iw in the torque-excepted (Fz) direction concerning the axis N2-N2 is expressed by the following formula (6).

$$Iw=2 \times Iw' \tag{6}$$

Accordingly, the second moment of area in the torque-excepted (Fz) direction concerning the axis N2-N2 is as follows.

$$Iw=576$$

Figure 8E:
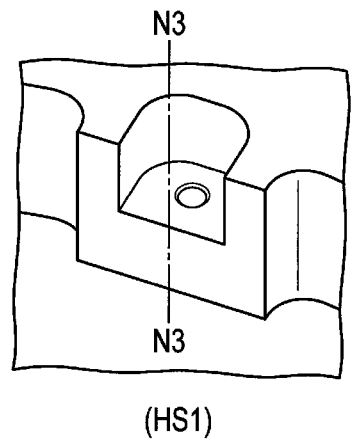
FIG. 8E is a view for explaining second moment of area in the torque (Mz) direction of FIG. 8A.

On the other hand, as shown in FIG. 8E, when force in the torque (Mz) direction is applied to the high-stiffness section HS1 having a U-shaped cross section, the second moment of area Js concerning the axis N3-N3 is as follows. Here, the axis N3-N3 is an axis passing through the center of the high-stiffness section HS1 in the width direction.

Figure 8F:
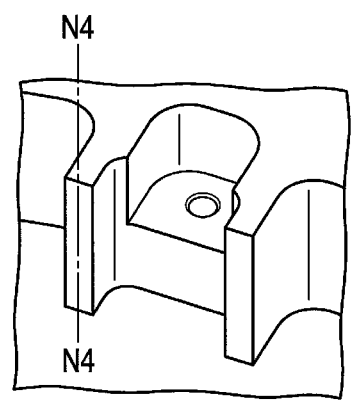
FIG. 8F is a view shown for explaining second moment of area in the torque (Mz) direction of FIG. 8B.
Figure 8G:
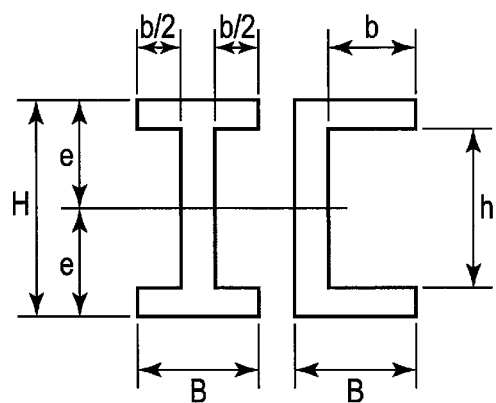
FIG. 8G is a view shown for explaining second moment of area of a structure different from FIG. 8C and FIG. 8D.

As shown in FIG. 8G, in general, when dimensions of a structure having an I-shaped cross section and structure having a U-shaped cross section satisfy the relationships of $b=B-a$, $h=H-2t$, the second moment of area of the structure having the I-shaped cross section and second moment of area of the structure having the U-shaped cross section are equal to each other, and are expressed by the following formula (7).

$$Js=(BH^3-bh^3)/12 \tag{7}$$

When the dimensions shown in FIG. 8A are substituted into the formula (7), the following result is obtained.

$$Js = (12 \times 14^3 - 6.2 \times 8^3)/12$$
$$= 2479$$

Further, as shown in FIG. 8F, when force in the torque (Mz) direction is applied to the low-stiffness sections LS1 and LS2 having rectangular cross sections, the second moment of area Jw' concerning the axis N4-N4 is expressed by the following formula (8) as previously described in connection with FIG. 8D. Here, the axis N4-N4 is an axis passing through the center of the low-stiffness section LS1 in the width direction.

$$Jw'=bh^3/12 \tag{8}$$

When the dimensions shown in FIG. 8B are substituted into the formula (8), the following result is obtained.

$$Jw' = 12 \times 2^3/12$$
$$= 8$$

The low-stiffness sections LS1 and Ls2 shown in FIG. 8F have two rectangular cross sections in all, and hence the second moment of area Jw in the torque (Mz) direction concerning the axis N4-N4 is expressed by the following formula (9).

$$Jw=2\times Jw' \tag{9}$$

Accordingly, the second moment of area Iw in the torque-excepted (Fz) direction concerning the axis N2-N2 is as follows.

$$Jw=16$$

When the second moment of area Is (=1440) in the torque-excepted (Fz) direction, Iw (=576), second moment of area Js (=2479) in the torque (Mz) direction, and Jw (=16) which are obtained in the aforementioned manner are substituted into the above formula (3), the following result is obtained and it can be seen that the condition of the formula (3) is satisfied.

$$Js/Jw>Is/Iw$$

$$2479/16>1440/576$$

$$155>2.5$$

Accordingly, it can be seen that the fourth structure 14 and fifth structure 15 are easily deformable with respect to the force in the torque (Mz) direction, and are hardly deformable with respect to the force in the torque-excepted (Fz) direction.

Figure 8H:
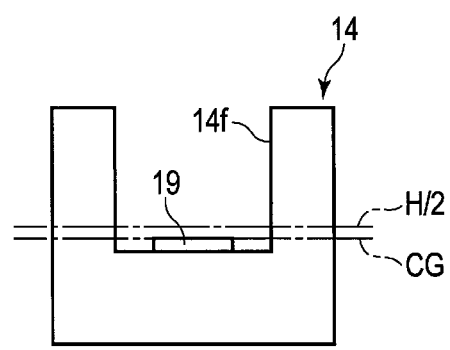
FIG. 8H is a view shown for explaining a positional relationship between a structure and strain body.

FIG. 8H shows a positional relationship between the concave section 14f and first strain sensor 19 (strain body). As described previously, the bottom of the concave section 14f is positioned at the center H/2 of the thickness of the fourth structure or lower. More specifically, in order to make the upper surface of the strain body constituting the first strain sensor 19 flush with the plane CG including the center of gravity of the structure constituted of the first structure 11, second structure 12, plurality of third structures 13, fourth structure 14, and fifth structure 15, the bottom of the concave section 14f is set at position lower than the plane CG including the center of gravity of the fourth structure by the thickness of the strain body. This position is in the neutral plane, and neither compressive force nor tensile force is exerted on the strain body at this position. Accordingly, it is possible to reduce the strain in the bend direction of the strain body, i.e., strain in the torque-excepted (Fz) direction.

Advantage of First Embodiment

According to the first embodiment, each of the fourth structure 14 provided with the first strain sensor 19 and fifth structure 15 provided with the second strain sensor 20 is provided with the first connection section 14a and second connection section 14b functioning as the high-stiffness sections with respect to the force in torque (Mz) direction and torque-excepted (Fz, Mx) direction, and third connection section 14c and fourth connection section 14d functioning as the low-stiffness sections with respect to the force in the torque (Mz) direction and functioning as the high-stiffness sections with respect to the force in the torque-expected (Fz, Mx) direction. Accordingly, it is possible to prevent the strain caused by the force in the torque-excepted direction from being concentrated at the strain gages 51, 52, 53, and 54 of each of the first strain sensor 19 and second strain sensor 20. Accordingly, it is possible to reduce the absolute amount of the strain to be applied to the strain gages 51, 52, 53, and 54, and greatly reduce the detection voltage of each of the first strain sensor 19 and second strain sensor 20 corresponding to the force in the torque-excepted direction. Accordingly, it is possible to provide a high-accuracy torque sensor capable of preventing torque axis interference and torque-excepted axis interference from occurring and preventing the size thereof from being increased.

Hereinafter, the advantage of the first embodiment will be described with reference to a comparative example.

FIG. 9 shows a comparative example of the torque sensor 10. A torque sensor 30 shown in FIG. 9 differs from the torque sensor 10 shown in the first embodiment in the configuration of each connection section of the first strain sensor 19 and second strain sensor 20, and the other configurations are identical to the first embodiment.

In the torque sensor 30, one end of each of the first strain sensor 19 and second strain sensor 20 is connected to a projection 11-1 provided on the first structure 11, and the other end of each of the strain sensors 19 and 20 is connected to a projection 12-1 provided on the second structure 12. Each of the projections 11-1 and 12-1 has a thickness equal to, for example, the first structure 11 and second structure 12. The gap between the projection 11-1 and projection 12-1 is equal to the length L1 of each of the third connection section 14c and fourth connection section 14d shown in FIG. 5.

In the torque sensor 30 as the comparative example, only the third structure 13 functions as a high-stiffness section with respect to the force in the torque direction and torque-excepted direction, and each of the first strain sensor 19 and second strain sensor 20 is only provided with a strain body between the first structure 11 and second structure 12. Accordingly, in each of the case where force in the torque (Mz) direction is applied to the torque sensor 30, and case where force in the torque-excepted (Fz, Mx) direction is applied to the torque sensor 30, strain is concentrated at the strain gages provided on the strain body of each of the first strain sensor 19 and second strain sensor 20.

Figures 10B, 11:
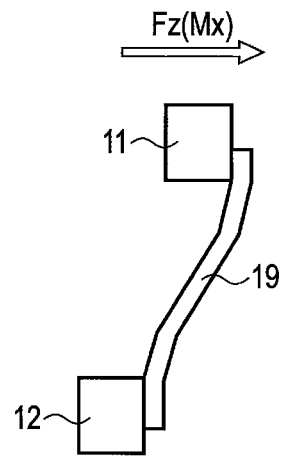
FIG. 10B is a side view shown for explaining an operation of a case where force in the torque-excepted (Fz, Mx) direction is applied to the torque sensor shown in FIG. 9.
FIG. 11 is a view showing the strain of a case where the same force is applied in each of the axial directions of each of the torque sensor of the first embodiment and torque sensor of the comparative example.

FIG. 10A and FIG. 10B are views each schematically showing FIG. 9, FIG. 10A shows a case where force in the torque (Mz) direction is applied to the torque sensor 30, and FIG. 10B shows a case where force in the torque-excepted (Fz, Mx) direction is applied to the torque sensor 30.

FIG. 11 shows the strain of a case where the same force is applied to each of the torque sensor 10 according to the first embodiment and torque sensor 30 according to the comparative example in each of the axial directions.

As is evident from FIG. 11, in the case of the torque sensor 10 according to the first embodiment, the strain corresponding to the force in the torque (Mz) direction is greater than the comparative example, and strain corresponding to the force in the torque-excepted (Fx, Fy, Fz, Mx, My) direction is less than the comparative example. Particularly, it can be seen that it is possible to make the strain corresponding to the force in each of the Fz and Mx directions remarkably smaller than the comparative example. Therefore, according to the first embodiment, it is possible to reduce the strain caused by the force in the torque-excepted direction in the first strain sensor 19 and second strain sensor 20, and prevent the detection accuracy of the first strain sensor 19 and second strain sensor 20 from being deteriorated.

Further, the upper surface of the strain body constituting the first strain sensor 19 is positioned flush with the plane CG including the center of gravity of the structure constituted of the first structure 11, second structure 12, plurality of third structures 13, fourth structure 14, and fifth structure 15. Accordingly, it is possible to reduce the strain in the bend direction of the strain body, i.e., strain in the torque-excepted (Fz) direction.

Second Embodiment

Figure 12:
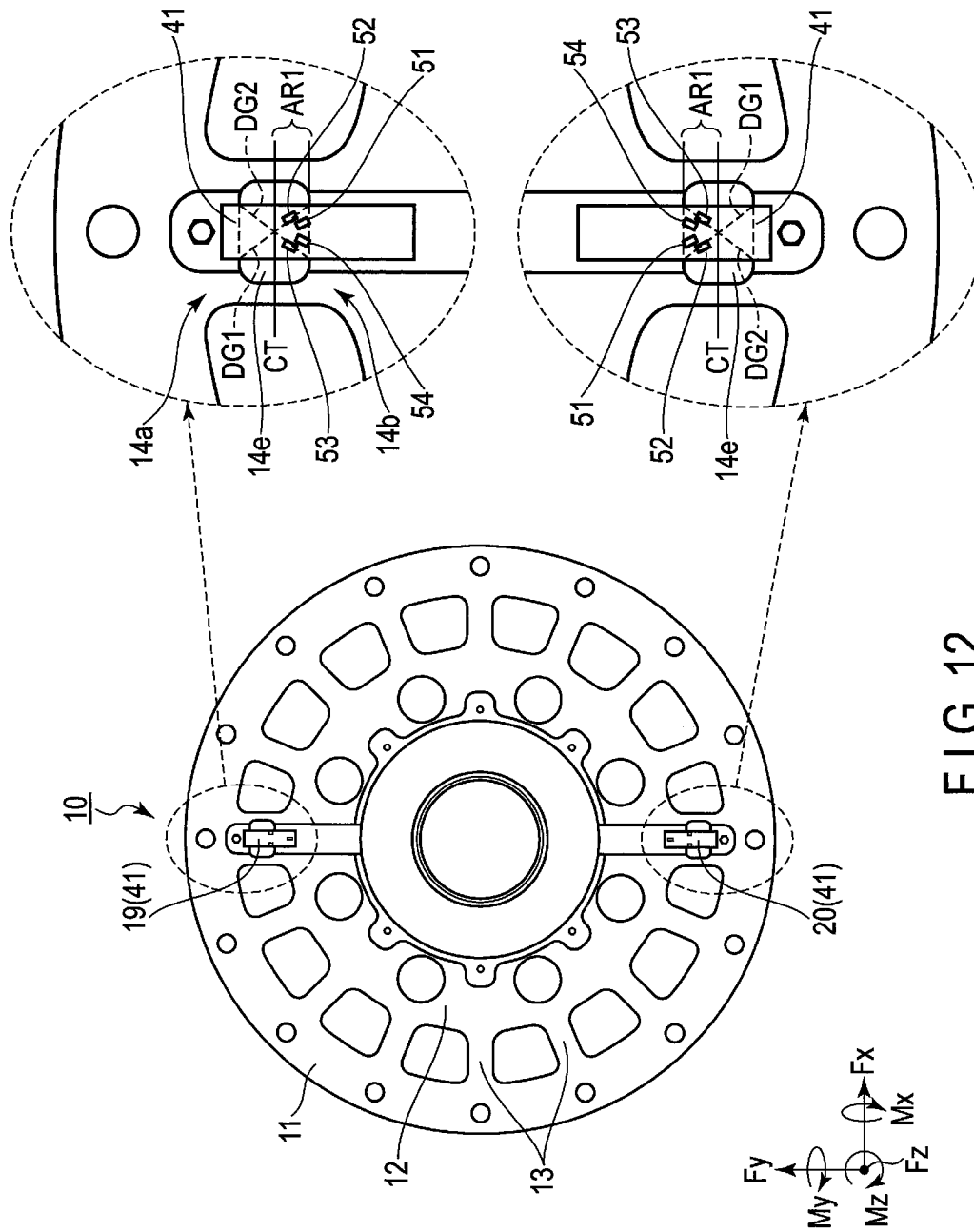
FIG. 12 is a plan view showing a second embodiment and showing a first strain sensor and second strain sensor.

FIG. 12 shows a second embodiment.

As described previously, a first strain sensor 19 is provided on a fourth structure 14, and second strain sensor 20 is provided on a fifth structure 15. Configurations of the first strain sensor 19 and second strain sensor 20 are identical to each other, and hence only the configuration of the first strain sensor 19 will be described below.

The first strain sensor 19 is provided with a strain body 41, and plurality of strain gages 51, 52, 53, and 54 serving as sensor elements arranged on the surface of the strain body 41.

The strain body 41 is constituted of a rectangular metallic plate, for example, stainless steel (SUS). The thickness of the strain body 41 is less than the thickness of the third structure 13.

Each of the strain gages 51, 52, 53, and 54 is constituted of, for example, a Cr—N thin-film resistive element provided on the strain body 41. The material for the thin-film resistive element is not limited to Cr—N.

The strain body 41 is connected to a first connection section 14a at one end thereof, and is connected to a second connection section 14b at the other end thereof. As the method of connecting the strain body 41 to the first connection section 14a and second connection section 14b, for example, a connection method using welding, screwing or an adhesive can be employed.

In the strain body 41, for example, a part thereof between a position at which the strain body 41 is welded to the first connection section 14a and position at which the strain body 41 is welded to the second connection section 14b functions as the substantial strain body. Accordingly, the effective length of the strain body 41 corresponds to the length from the position at which the strain body 41 is connected to the first connection section 14a to the position at which the strain body 41 is connected to the second connection section 14b.

The plurality of strain gages 51, 52, 53, and 54 are arranged on the strain body 41 in the area AR1 on the second structure 12 side of the central part CT of the effective length of the strain body 41. This area AR1 is within the range of an opening 14e, and is an area in which great strain is caused to the strain body 41. As will be described later, this area AR1 is an area in which the sensitivity of the first strain sensor 19 to the force in the torque-excepted direction, for example, Fx or My direction and sensitivity of the first strain sensor 19 to the force in the torque (Mz) direction become identical to each other.

The strain gages 51, 52, 53, and 54 are arranged in the area AR1 in such a manner that the longitudinal direction of each of the strain gages 51, 52, 53, and 54 is made along two diagonal lines DG1 and DG2 of the strain body 41. That is, the strain gages 51 and 52 are arranged in such a manner that the longitudinal direction of each of the strain gages 51 and 52 is set along one diagonal line DG1 indicated by a broken line, and strain gages 53 and 54 are arranged in such a manner that the longitudinal direction of each of the strain gages 53 and 54 is set along the other diagonal line DG2 indicated by a broken line. The diagonal lines DG1 and DG2 each correspond to a rectangular area positioned within the opening 14e of the strain body 41.

The strain gages 51, 52, 53, and 54 of the first strain sensor 19 constitute one bridge circuit, and strain gages 51, 52, 53, and 54 of the second strain sensor 20 also constitute one bridge circuit. Accordingly, the torque sensor 10 comprises two bridge circuits.

Figure 13:
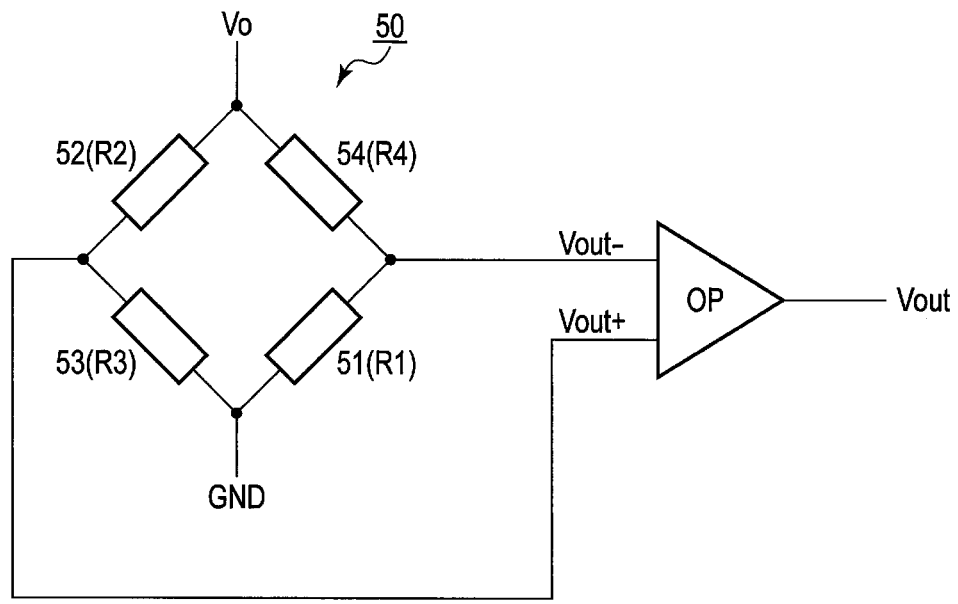
FIG. 13 is a circuit diagram showing an example of a bridge circuit of the first strain sensor.

FIG. 13 shows an example of a bridge circuit 50 of the first strain sensor 19. The second strain sensor 20 also comprises a bridge circuit of a configuration identical to the bridge circuit 50. Each of an output voltage of the bridge circuit 50 of the first strain sensor 19 and output voltage of the bridge circuit 50 of the second strain sensor 19 is compensated for an offset, temperature or the like thereof by using, for example, software not shown. Thereafter, the output voltage of the bridge circuit 50 of the first strain sensor 19 and output voltage of the bridge circuit 50 of the second strain sensor 19 are unified into one result and the result is output as a detection voltage of the torque sensor 10. Compensation for an offset, temperature or the like is not limited to software, and is enabled by hardware.

In the bridge circuit 50, a series circuit of the strain gage 52 and strain gage 53 and series circuit of the strain gage 54 and strain gage 51 are each arranged between the power source Vo and ground GND. An output voltage Vout+ is output from a connection node of the strain gage 52 and strain gage 53, and output voltage Vout− is output from a connection node of the strain gage 54 and strain gage 51. The output voltage Vout+ and output voltage Vout− are supplied to an operational amplifier OP, and an output voltage Vout is output from an output end of the operational amplifier OP.

When force in the torque (Mz) direction is applied to the torque sensor 10, the output voltage Vout of the torque sensor 10 shown by a formula (10) is obtained from the output voltage Vout+ of the one connection node of the bridge circuit 50 and output voltage Vout− of the other connection node.

$$Vout = (Vout + - Vout -) \quad (10)$$
$$= (R3/(R2 + R3) - R1/(R1 + R4)) \cdot Vo$$

Here, R1 is a resistance value of the strain gage 51, R2 is resistance value of the strain gage 52, R3 is resistance value of the strain gage 53, and R4 is resistance value of the strain gage 54.

In a state where no torque is applied to the torque sensor 10, ideally, R1, R2, R3, and R4 are all equal to each other and are equal to R (R1=R2=R3=R4=R). However, actually, there are variations in the resistance values and, in the state where no torque is applied to the torque sensor 10, a voltage incidental to the variation in the resistance values is output. This voltage is made zero by offset adjustment.

On the other hand, when force in the torque-excepted direction, e.g., force in the Fx or My direction is applied to the torque sensor 10, the resistance values R1 to R4 are changed, whereby the output voltage Vout is output from the bridge circuit 50. However, as the output voltage of the bridge circuit 50 of the second strain sensor 20, a voltage having a positive/negative sign opposite to the output voltage of the bridge circuit 50 of the first strain sensor 19 is output. Accordingly, the output voltages in those bridge circuits 50 are identical to each other in absolute value and different from each other in positive/negative sign, and hence cancel each other out, and the detection voltage becomes 0 volt.

It is desirable that the strain gages 51, 52, 53, and 54 functioning as the sensor elements should output the same voltage when the amount of displacement is the same in both the torque (Mz) direction and torque-excepted (Fx, My) direction. Accordingly, it is desirable that the strain gages 51, 52, 53, and 54 be arranged in such an area that the strain of the strain body 41 is the same (such an area that has the same measurement sensitivity) in both the torque (Mz) direction and torque-excepted (Fx, My) direction.

Figure 14:
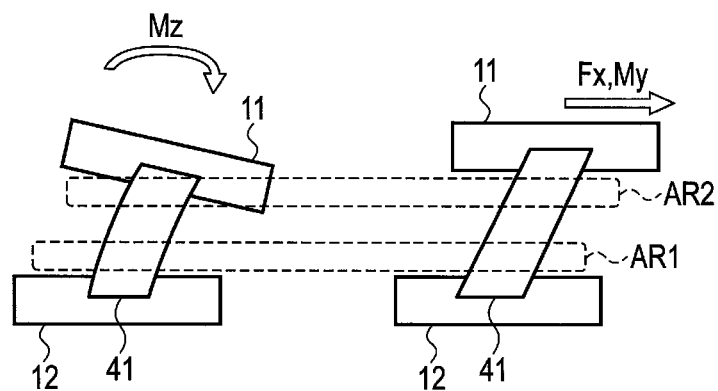
FIG. 14 is a view shown for explaining the states of a strain body in the case where force in the torque direction is applied to a torque sensor of the second embodiment and in the case where force in the torque-excepted direction is applied thereto.

FIG. 14 schematically shows the states of the strain body 41 in the case where force in the torque (Mz) direction is applied to the torque sensor 10 and in the case where force in the torque-excepted (Fx, My) direction is applied thereto.

When the behavior of the strain body 41 provided between the first structure 11 and second structure 12 is macroscopically observed, it seems that the strain body 41 is made to change in the shearing direction in both the case where force in the torque (Mz) direction is applied to the torque sensor 10 and case where force in the torque-excepted (Fx, My) direction is applied thereto.

However, when the behavior of the strain body 41 provided between the first structure 11 and second structure 12 is microscopically observed, in the case where the force in the torque (Mz) direction is applied to the torque sensor 10, turning force (torque) is exerted on the strain body 41. On the other hand, in the case where the force in the torque-excepted (Fx, My) direction is applied to the torque sensor 10, translational force is exerted on the strain body 41. Accordingly, deformation of the strain body 41 differs between the case where the force in the torque (Mz) direction is applied and case where the force in the torque-excepted (Fx, My) direction is applied.

That is, a difference is caused between the deformation of the strain body 41 in the area AR1 on the second structure 12 side and deformation of the strain body 41 in the area AR2 on the first structure 11 side. More specifically, a difference between the strain of the strain body 41 in the case where force in the torque (Mz) direction is applied in the area AR1 of the strain body 41 and strain of the strain body 41 in the case where force in the torque-excepted (Fx, My) direction is applied therein is less than a difference between the strain of the strain body 41 in the case where force in the torque (Mz) direction is applied in the area AR2 of the strain body 41 and strain of the strain body 41 in the case where force in the torque-excepted (Fx, My) direction is applied.

That is, in the area AR1 on the second structure 12 side, a difference between the strain of the strain body 41 in the case where force in the torque (Mz) direction is applied and strain of the strain body 41 in the case where force in the torque-excepted (Fx, My) direction is applied is small.

Accordingly, when the plurality of strain gages 51, 52, 53, and 54 are arranged in the area AR1, a difference between the torque (Mz) detection sensitivity and torque-excepted (fx, My) detection sensitivity is as small as less than 1%. Conversely, when the plurality of strain gages 51, 52, 53, and 54 are arranged in the area AR2, a difference between the torque detection sensitivity and torque-excepted detection sensitivity is several percent. Therefore, it is desirable that the plurality of strain gages 51, 52, 53, and 54 be arranged in the area AR1 on the second structure 12 side.

Advantage of Second Embodiment

According to the second embodiment described above, each of the first strain sensor 19 and second strain sensor 20 comprises the strain body 41 connected between the first structure 11 and second structure 12, and plurality of strain gages 51, 52, 53, and 54 serving as the sensor elements provided on the strain body 41, and the plurality of strain gages 51, 52, 53, and 54 are arranged in the area AR1 on the second structure 12 side of the central part CT of the strain body 41 in the longitudinal direction thereof. The area AR1 of the strain body 41 is an area in which a difference between the strain (sensitivity) (a1, a2) of the case where force in the torque direction is applied to each of the first strain sensor 19 and second strain sensor 20 and strain (sensitivity) (b1, b2) of the case where force in the torque-excepted direction is applied thereto is small (a1≈b1, a2≈b2, a1≠a2). Accordingly, by adjusting each of the first strain sensor 19 and second strain sensor 20 in torque sensitivity, it is possible to prevent the torque detection sensitivity from being deteriorated independently of the machining accuracy of the first structure 11, second structure 12, and third structures 13, and further independently of the arrangement accuracy of the first strain sensor 19 and second strain sensor 20 relative to the first structure 11 and second structure 12.

Moreover, in the bridge circuit 50 arranged in the area AR1 of the strain body 41, a difference between the detection sensitivity to force in the torque direction and detection sensitivity to force in the torque-excepted direction is small, and hence an error in the output voltage of each of the first strain sensor 19 and second strain sensor 20 is also small. Therefore, at the time of calibration of the voltage output from each of the two bridge circuits 50, it is possible to also calibrate the detection error in regard to torque-excepted items by only calibrating the detection error in regard to torque. Accordingly, there is no need to provide a separate strain sensor in order to detect the force in the torque-excepted (Fx, My) direction, and hence it is possible to shorten the calibration time, and realize a high-speed response.

Hereinafter, the advantage of the second embodiment will specifically be described.

Figure 15:
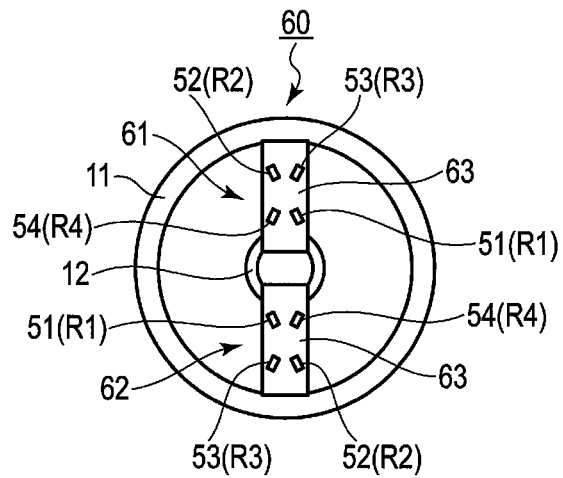
FIG. 15 is a view schematically showing a torque sensor according to a comparative example of the second embodiment.

FIG. 15 schematically shows a torque sensor 60 according to a comparative example. This torque sensor 60 comprises a first strain sensor 61 and second strain sensor 62 between a first structure 11 and second structure 12. Each of the first strain sensor 61 and second strain sensor 62 includes a strain body 63, and a plurality of strain gages 51, 52, 53, and 54 constituting a bridge circuit shown in FIG. 13 are arranged on each of the strain bodies 63. FIG. 15 is a schematic view, and hence third structures 13 are omitted.

In the comparative example, arrangement of the strain gages 51, 52, 53, and 54 is different from the second embodiment. That is, the strain gages 52 and 53 are arranged in the area of the strain body 63 on the first structure 11 side, and strain gages 51 and 54 are arranged in the area of the strain body 63 on the second structure 12 side.

In the case of the configuration shown in FIG. 15, regarding the strain gages 52 and 53 arranged in the area on the first structure 11 side, the strain of the strain body 63 differs between the torque (Mz) direction and torque-excepted (Fx, My) direction. Accordingly, the difference between the sensitivity of the first strain sensor 61 or sensitivity of the second strain sensor 62 of the case where force in the torque (Mz) direction is applied and sensitivity of the first strain sensor 61 or sensitivity of the second strain sensor 62 of the case where force in the torque-excepted (Fx, My) direction is applied is great.

More specifically, when force in the torque-excepted (Fx, My) direction is applied to the torque sensor 60, the sensitivity in the torque-excepted (Fx, My) direction differs from the sensitivity in the torque (Mz) direction, and hence the value (positive value) of the output voltage of the first strain sensor 61 and value (negative value) of the output voltage of the second strain sensor 62 differ from each other. Accordingly, the torque sensor 60 outputs an error constituted of an average value of the first strain sensor 61 and second strain sensor 62.

On the other hand, in the case of the torque sensor 10 of the second embodiment, when force in the torque-excepted (Fx, My) direction is applied to the torque sensor 10, the sensitivity in the torque-excepted (Fx, My) direction is coincident with the sensitivity in the torque (Mz) direction. Accordingly, the value (positive value) (Vout1) of the output voltage of the first strain sensor 19 and value (negative value) (−Vout2) of the output voltage of the second strain sensor 20 become approximately equal to each other (|Vout1|≈|−Vout2|). Accordingly, the output voltages of the first strain sensor 61 and second strain sensor 62 cancel each other out, and thus the output of the torque sensor 10 becomes approximately zero. Therefore, in the case of the second embodiment, it is possible to reduce the detection error in regard to the force in the torque-excepted (Fx, My) direction.

In the case of the torque sensor 60 according to the comparative example, the error in the output voltage of each of the first strain sensor 61 and second strain sensor 62 is great (|Vout1|≠|−Vout2|) between the torque (Mz) direction and torque-excepted (Fx, My) direction. Accordingly, in order to calibrate these errors, there is a need to carry out both of calibration for correction of the detection error in the torque direction and calibration for correction of the detection error in the torque-excepted direction. Therefore, the torque sensor 60 according to the comparative example needs to be separately provided with a bridge circuit including strain gages configured to detect force in the torque-excepted direction. Therefore, regarding the torque sensor 60 according to the comparative example, the circuit board is upsized, time of arithmetic processing to be carried out by software is increased, adjustment work is complicated as compared with the second embodiment, and responsiveness is deteriorated.

On the other hand, in the case of the second embodiment, there is hardly any error in the output voltage of each of the first strain sensor 19 and second strain sensor 20 between the torque (Mz) direction and torque-excepted (Fx, My) direction. Accordingly, it is sufficient if only the detection error in the torque direction is corrected. Therefore, it is possible to shorten the calibration time and improve the responsiveness of the torque sensor.

Further, the second embodiment is not limited to the configuration of the torque sensor 10, and it is sufficient if the strain gages 51, 52, 53, and 54 are arranged in the area AR1. Therefore, even when the arrangement according to the second embodiment is applied to, for example, the torque sensor 30 having the configuration shown in FIG. 9, an advantage identical to the second embodiment can be obtained.

Third Embodiment

Figure 16:
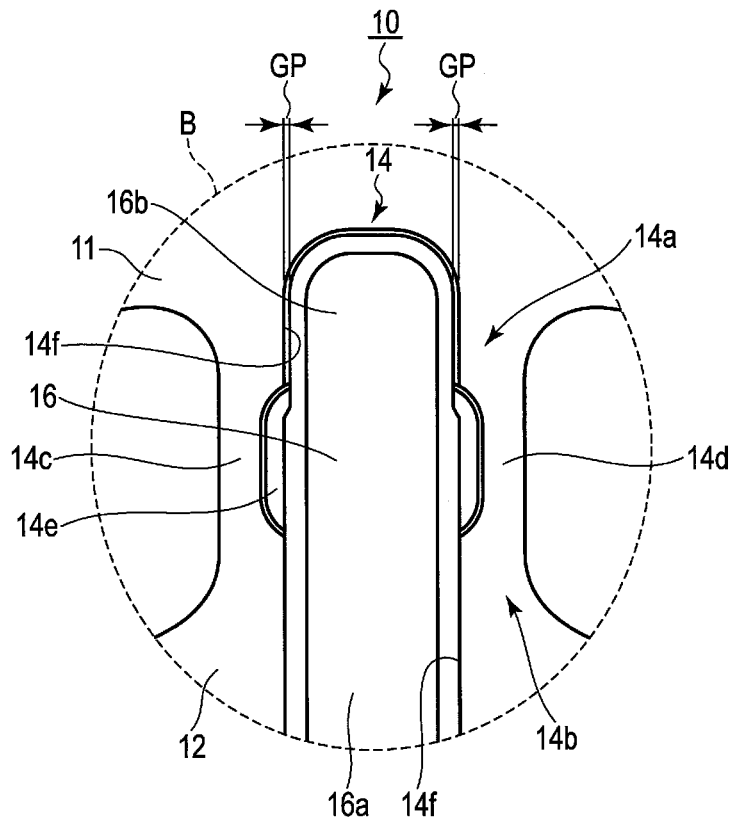
FIG. 16 is a plan view showing a third embodiment and showing the part indicated by B of FIG. 1 in an enlarging manner.

FIG. 16 is a view showing a third embodiment, and shows the part indicated by B in FIG. 1 in an enlarging manner.

As described previously with reference to FIG. 2, the first strain sensor 19 is covered with the stopper 16 and second strain sensor 20 is covered with the stopper 17. The stopper 16 and stopper 17 are formed of, for example, stainless steel or ferrous alloy. The stopper 16 and stopper 17 prevent mechanical deformation of the first strain sensor 19 and second strain sensor 20 from occurring, and protect the strain gages 51, 52, 53, and 54. Furthermore, the stopper 16 and stopper 17 each double as waterproof covers of the first strain sensor 19 and second strain sensor 20. A description of the specific waterproof structure is omitted.

The stopper 16 and stopper 17 are identical in configuration, and hence only the stopper 16 will be described below.

As shown in FIG. 16, the stopper 16 includes a one end 16a and the other end 16b, and a width of the other end 16b is made narrower than the width of the one end 16a. The one end 16a of the stopper 16 is, for example, press-fitted into the concave section 14f serving as an engaging section formed on the second structure 12 side of the fourth structure 14, and is fixed therein. The other end 16b of the stopper 16 is arranged inside the concave section 14f formed on the first structure 11 side of the fourth structure 14. The width of the other end 16b of the stopper 16 is narrower than the width of the concave section 14f provided on the first structure 11 side, and between the both sides of the other end 16b of the stopper 16 and side faces of the concave section 14f, gaps GP are provided.

The gap GP is determined according to the stiffness of the third structure 13 and rated torque.

More specifically, when torque of, for example, 1000 N·m is applied to the torque sensor 10, if the first structure 11 is deformed by, for example, 10 μm relatively to the second structure 12, the gap GP is set to, for example, 10 μm.

FIG. 17A, and FIG. 17B are views showing the operation of the stopper, and schematically shows part of FIG. 16.

As shown in FIG. 17A, when no torque is applied to the torque sensor 10, between each of the both sides of the other end 16b of the stopper 16 and concave section 14f, a predetermined gap GP is provided. In this state, when torque equal to or less than the rated torque is applied to the torque sensor 10, the first structure 11 is displaced relatively to the second structure 12, and a voltage corresponding to the applied torque is output from the first strain sensor 19. When the application of the torque to the torque sensor is removed, the first strain sensor 19 is restored by elastic deformation.

On the other hand, as shown in FIG. 17B, when torque greater than the rated torque is applied to the torque sensor 10, the side face of the concave section 14f of the first structure 11 is brought into contact with the other end 16b of the stopper 16, displacement of the first structure 11 relative to the second structure 12 is limited. Accordingly, the first strain sensor 19 is protected within the range of elastic deformation. When the application of the torque to the torque sensor 10 is removed, the first strain sensor 19 is restored by the elastic deformation. The second strain sensor 20 is also protected by the same configuration.

FIG. 18 is a view for explaining a relationship between the torque to be applied to the torque sensor 10 as the load and operation of the stopper 16, and schematically shows a relationship between the torque to be applied to the torque sensor 10 and detected strain (output voltage of bridge circuit 50).

As shown in FIG. 18, when torque equal to or less than the rated torque is applied to the torque sensor 10, regarding the strain body 41 of the first strain sensor 19 (second strain sensor 20), the first structure 11 is displaced relatively to the second structure 12, and a voltage corresponding to the applied torque is output from the first strain sensor 19 (second strain sensor 20).

On the other hand, when torque greater than the rated torque is applied to the torque sensor 10, the side face of the concave section 14f is brought into contact with the stopper 16, deformation of the plurality of third structures 13 is suppressed by the stiffness of the stopper 16 (stopper 17) and, concomitantly with the suppression, deformation of the strain body 41 is suppressed. That is, the operating point Op of the stopper 16 is set to a value equal to the rated torque, and stopper 16 protects the strain body 41 against torque greater than the rated torque.

Advantage of Third Embodiment

According to the third embodiment described above, the stopper 16 (stopper 17) serving as the cover is provided on each of the first strain sensor 19 and second strain sensor 20, the one end 16a of the stopper 16 is fixed in the part of the concave section 14f on the second structure 12 side and, when torque greater than the rated torque is applied to the torque sensor 10, the other end 16b is brought into contact with the side face of the concave section 14f on the first structure 11 side. Accordingly, it is possible to protect the first strain sensor 19 and second strain sensor 20. Furthermore, the structures other than the first strain sensor 19 and second strain sensor 20 are also protected from plastic deformation or the like as in the case of the first strain sensor 19 or second strain sensor 20.

Moreover, it is possible to make the rated torque of the torque sensor 10 closer to the 0.2% proof stress of the strain gage. Accordingly, it is possible to enhance the output voltage of the bridge circuit 50 at the rated torque. Accordingly, it is possible to provide a high-resolution high-accuracy torque sensor.

Figure 19:
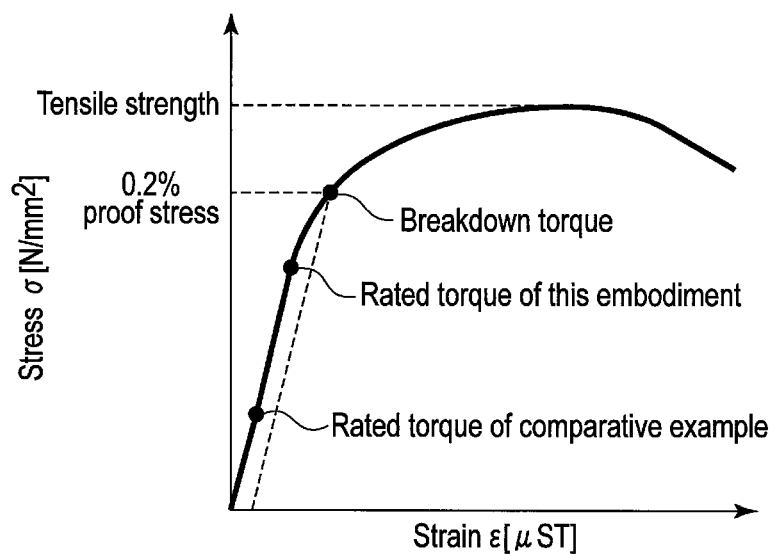
FIG. 19 is a view showing a relationship between the strain of the strain gage and stress.

FIG. 19 is a view showing a relationship between the strain and stress of a strain gage, and shows the rated torque of the torque sensor according to the third embodiment, and rated torque of a torque sensor as the comparative example having no stopper 16 and stopper 17.

In the case of a general torque sensor as the comparative example having no stopper 16 and stopper 17, the strain gage is designed by setting the safety factor for shock or fatigue to about 3 to 5. When the safety factor is made, for example, 3, the stress of the strain gage is set to one-third of the 0.2% proof stress. Accordingly, the rated torque is also set to one-third of the breakdown torque.

Conversely, in the case of the third embodiment, the first strain sensor 19 and second strain sensor 20 are respectively protected by the stopper 16 and stopper 17, and hence there is no need to set the safety factor of the strain gage to 1 or more. Accordingly, it is possible to set the rated torque of the strain gage to a value greater than the general torque sensor having no stopper 16 and stopper 17. Accordingly, it is possible to provide a high-resolution high-accuracy torque sensor.

Furthermore, by enhancing the stiffness of the stopper 16, it is possible to provide a high-allowable load (high-maximum torque) torque sensor.

Modification Example

Figure 20:
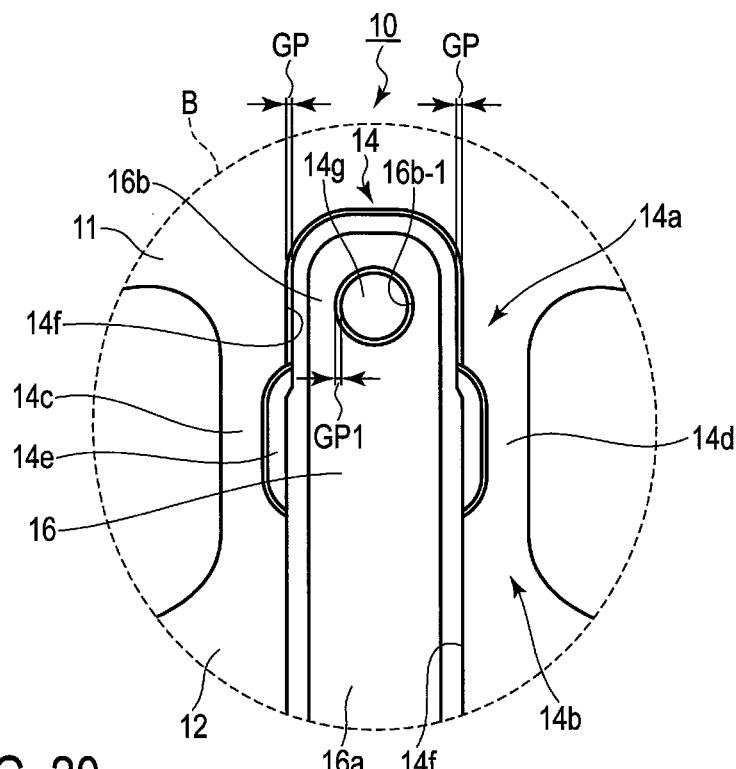
FIG. 20 is a plan view showing a first modification example of the third embodiment and showing part of the first modification example in an enlarging manner.

FIG. 20 is a view showing a first modification example of the third embodiment. In the third embodiment, the stopper 16 protects the first strain sensor 19 by being brought into contact with the side face of the concave section 14f on the first structure 11 side at the other end 16b thereof.

In the first modification example, the other end 16b of the stopper 16 includes an opening 16b-1 and, on the first structure 11 side of the fourth structure 14, a projection 14g inserted in the opening 16b-1 is provided. Between the opening 16b-1 and projection 14g, a gap GP1 is provided. The dimension of the gap GP1 is less than, for example, the dimension of the gap GP. Accordingly, when torque greater than the allowable torque is applied to the torque sensor 10, the projection 14g is brought into contact with the opening 16b-1 of the stopper 16, whereby it is possible to protect the first strain sensor 19.

The stopper 17 of the second strain sensor 20 also comprises a configuration identical to the stopper 16.

By the first modification example described above too, it is possible to obtain an advantage identical to the third embodiment. Moreover, according to the first modification example, the projection 14g is brought into contact with the opening 16b-1 of the stopper 16, whereby it is possible to more securely protect the first strain sensor 19 (second strain sensor 20).

FIG. 21 shows a second modification example of the third embodiment.

Whereas the third embodiment comprises the stopper 16 and stopper 17, the second modification example, furthermore, comprises four stoppers 16-1, 16-2, 17-1, and 17-2. The structure of each of the stoppers 16-1, 16-2, 17-1, and 17-2 is identical to the stoppers 16 and stopper 17.

By the second modification example too, it is possible to obtain an advantage identical to the third embodiment. Moreover, according to the second modification example, the number of stoppers is greater than the third embodiment, and hence it is possible to more securely protect the first strain sensor 19 and second strain sensor 20.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A torque sensor comprising:
   a first structure;
   a second structure;
   a plurality of third structures connecting the first structure and the second structure; and
   at least one strain sensor connected between the first structure and the second structure;
   wherein
   the at least one strain sensor comprises a rectangular strain body connected between the first structure and the second structure and including a surface parallel to plane surfaces of the first structure and the second structure, and a plurality of sensor elements provided on the surface of the rectangular strain body, the plurality of sensor elements are disposed in a region of one side of each of the first structure and the second structure with respect to a longitudinal central portion of the rectangular strain body, and the region on the one side is a region where a strain of the rectangular strain body against a force in a torque direction is equal to a strain of the rectangular strain body against a force in a torque-excepted direction.

2. The torque sensor of claim 1, wherein
   the first structure is annular, and the second structure is annular,
   the second structure is arranged concentrically inside the first structure, and
   the plurality of sensor element provided on the rectangular strain body of the strain sensor are disposed in an area on a side of the second structure with respect to the longitudinal central portion of the rectangular strain body.

3. The torque sensor of claim 1, wherein
   the strain sensor comprises a bridge circuit including the plurality of sensor elements.

4. The torque sensor of claim 2, wherein
   the strain sensor comprises the bridge circuit including the plurality of sensor elements.

5. The torque sensor of claim 2, wherein
   the at least one strain sensor is provided in a symmetric position with respect to a center of each of the first structure and the second structure.

* * * * *